United States Patent
Matsushita et al.

(10) Patent No.: US 11,574,231 B2
(45) Date of Patent: Feb. 7, 2023

(54) QUANTUM COMPUTER, NON-TRANSITORY COMPUTER READABLE MEDIA STORING PROGRAM, QUANTUM CALCULATION METHOD, AND QUANTUM CIRCUIT

(71) Applicant: TOKYO INSTITUTE OF TECHNOLOGY, Tokyo (JP)

(72) Inventors: Yuichiro Matsushita, Tokyo (JP); Taichi Kosugi, Tokyo (JP)

(73) Assignee: TOKYO INSTITUTE OF TECHNOLOGY

( * ) Notice: Subject to any disclaimer, the term of this patent is extended or adjusted under 35 U.S.C. 154(b) by 62 days.

(21) Appl. No.: 17/350,091

(22) Filed: Jun. 17, 2021

(65) Prior Publication Data
US 2021/0406754 A1  Dec. 30, 2021

(30) Foreign Application Priority Data
Jun. 26, 2020 (JP) .............................. JP2020-110658

(51) Int. Cl.
*G06N 10/00* (2022.01)
*H03K 19/195* (2006.01)

(52) U.S. Cl.
CPC ........... *G06N 10/00* (2019.01); *H03K 19/195* (2013.01)

(58) Field of Classification Search
CPC .......................... G06N 10/00; H03K 19/195
See application file for complete search history.

(56) References Cited

U.S. PATENT DOCUMENTS

2020/0169396 A1* 5/2020 Neven .................... G06N 3/063
2021/0374591 A1* 12/2021 Kliuchnikov .......... G06N 10/20

FOREIGN PATENT DOCUMENTS

JP  2015-135377 A  7/2015

OTHER PUBLICATIONS

Taichi Kosugi and Yu-ichiro Matsushita, "Construction of Green's Functions on a Quantum Computer: Applications To Molecular Systems", Tokyo Institute of Technology, Laboratory for Materials and Structures, Institute of Innovative Research, Aug. 13, 2019, (18 Pages).

Taichi Kosugi and Yu-ichiro Matsushita, "Construction of Green's Functions on a Quantum Computer: Quasiparticle Spectra of Molecules", Tokyo Institute of Technology, Laboratory for Materials and Structures, Institute of Innovative Research, Jan. 16, 2020, (18 Pages).

(Continued)

*Primary Examiner* — Kurtis R Bahr
(74) *Attorney, Agent, or Firm* — Harness, Dickey & Pierce, P.L.C.

(57) ABSTRACT

A quantum computer includes: a setting unit configured to set a parameter group of n layers based on each coefficient in a linear sum of unitary operators whose number is 2 to the n-th power, wherein the parameter group of k-th ($2 \leq k \leq n$) layer is recursively set based on the parameter group of (k−1)-th layer; a quantum gate having n+m qubits including n auxiliary qubits and m target qubits, and configured to execute a predetermined calculation on an input value input to each qubit based the parameter group of n layers; and a specification unit configured to specify the linear sum of the unitary operators based on a calculation result of the quantum gate.

20 Claims, 11 Drawing Sheets

(56) References Cited

OTHER PUBLICATIONS

Taichi Kosugi and Yu-ichiro Matsushita, "Charge and Spin Response Functions on a Quamtum Computer: Applications to Molecules", Tokyo Institute of Technology, Laboratory for Materials and Structures, Institute of Innovative Research, Nov. 4, 2019 (15 Pages).

Taichi Kosugi and Yu-ichiro Matsushita, "Linear-Response Functions of Molecules on a Quantum Computer: Charge and Spin Responses and Optical Absorption", Tokyo Institute of Technology, Laboratory for Materials and Structures, Institute of Innovative Research, Jan. 17, 2020 (20 Pages).

Taichi Kosugi and Yu-ichiro Matsushita, "Construction of Green's Functions on a Quantum Computer: Quasiparticle Spectra of Molecules", Physical Review A 101, Tokyo Institute of Technology, Laboratory for Materials and Structures, Institute of Innovative Research, Jan. 17, 2020 (12 Pages).

* cited by examiner

QUANTUM COMPUTER, NON-TRANSITORY COMPUTER READABLE MEDIA STORING PROGRAM, QUANTUM CALCULATION METHOD, AND QUANTUM CIRCUIT

CROSS REFERENCE TO RELATED APPLICATIONS

The present application claims priority under 35 U.S.C. § 119 to Japanese Patent Application No. 2020-110658, filed Jun. 26, 2020.

BACKGROUND

Technical Field

The present invention relates to a quantum computer, a non-transitory computer readable media storing a program, a quantum calculation method, and a quantum circuit.

Related Art

Computers that used quantum mechanics for information processing were proposed in the 1980s, and various quantum information processing technologies are still being proposed presently.

For instance, Japan unexamined Patent Application Publication No. 2015-135377 discloses a prior art of a quantum computer and a quantum calculation method.

However, some physical quantities and physical functions include linear sums of unitary operators. Although unitary operators are generally handled in quantum calculation, since there is no method for quantum calculation of a generic linear sum of unitary operators, it is necessary to calculate such physical quantities and physical functions, and a classical algorithm must be used. For this reason, a classical computer is used, but since the classical computer has a limit in the amount of calculation and the calculation speed, this can be a barrier to calculation.

SUMMARY OF INVENTION

In view of the above circumstances, the present invention provides a technique for quantum computation of the generic linear sum of unitary operators.

The present invention provides a quantum computer, comprising: a setting unit configured to set a parameter group of n layers based on each coefficient in a linear sum of unitary operators whose number is 2 to the n-th power, wherein the parameter group of k-th (2≤k≤n) layer is recursively set based on the parameter group of (k−1)-th layer; a quantum gate having n+m qubits including n auxiliary qubits and m target qubits, and configured to execute a predetermined calculation on an input value input to each qubit based on the parameter group of n layers; and a specification unit configured to specify the linear sum of the unitary operators based on a calculation result of the quantum gate.

Since the linear sum of the unitary operators can be calculated with quantization, physical quantities and physical functions including the linear sum of the unitary operators can be calculated instead of the classical algorithm in such a quantum computer.

DETAILED DESCRIPTION OF EMBODIMENTS

Hereinafter, an embodiment of the present invention will be described with reference to the drawings. Various features described in the embodiment below can be combined with each other.

Further, in the present embodiment, the "unit" may include, for example, a combination of hardware resources implemented by a circuit in a broad sense and information processing of software that can be concretely realized by these hardware resources. In addition, various information is handled in this embodiment, and these information are represented by quantum superposition (so-called qubits), and communication/operation can be executed on a circuit in a broad sense including a memory 4 and a quantum processor 5.

1. Hardware Configuration

In this section, the hardware configuration of a quantum computer 1 according to the present embodiment will be described.

Figure 1:
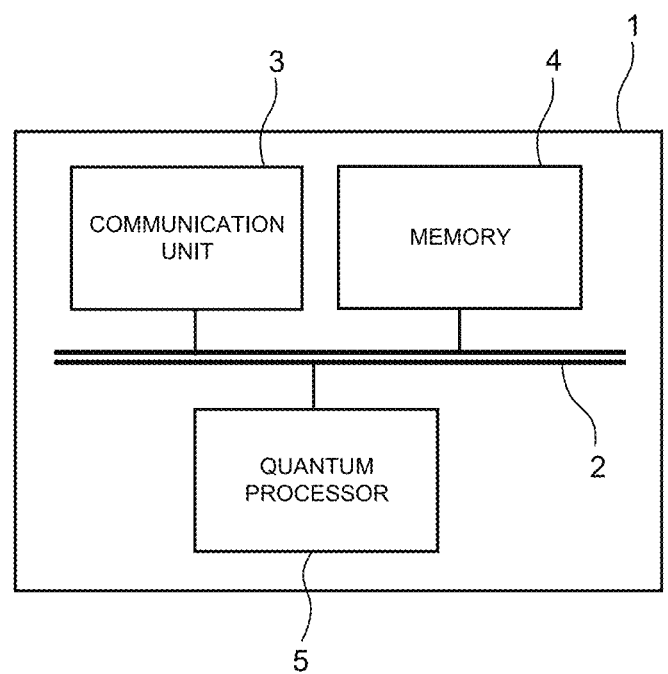
FIG. 1 is a block diagram showing a hardware configuration of a quantum computer 1.

FIG. 1 is a block diagram showing the hardware configuration of the quantum computer 1. As shown in FIG. 1, the quantum computer 1 includes a communication unit 3, a memory 4, and a quantum processor 5. These components are connected to each other inside the quantum computer 1 via a communication bus 2. Hereinafter, each component will be further described.

(Communication Unit 3)

The communication unit 3 is used for the quantum computer 1 to perform information communication with another information processing device (a classical computer, a quantum computer, or a computer combines them) or a peripheral device.

(Memory 4)

The memory 4 stores various information defined by the above description. In particular, the memory 4 stores various programs that can be read by the quantum processor 5 described below. Further, the memory 4 stores physical property information and the like of a specific material related to the calculation of the quantum computer 1 as necessary.

(Quantum Processor 5)

Figure 2:
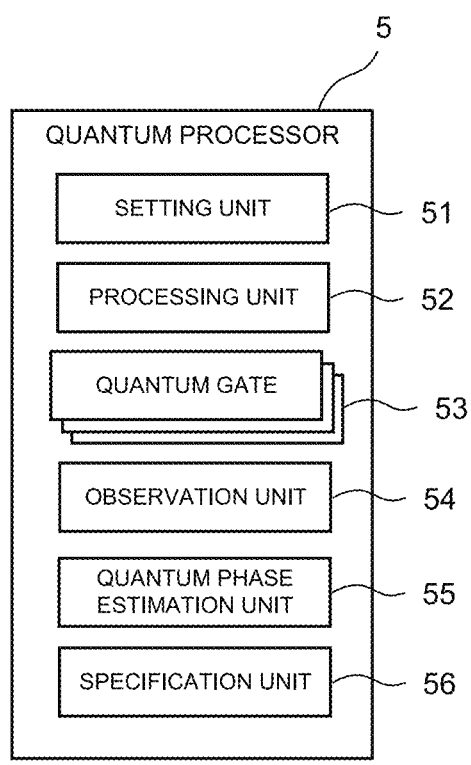
FIG. 2 is a block diagram showing a functional configuration of a quantum computer 1 (quantum processor 5).

The quantum processor 5 processes and controls the overall operation related to the quantum computer 1. The quantum processor 5 realizes various functions related to the quantum computer 1 by reading a program stored in the memory 4 or a predetermined program input via the communication unit 3. That is, information processing by software (stored in the memory 4 or input from another information processing device via the communication unit 3) is specifically realized by the hardware (quantum processor 5). Then, it can be executed as each functional unit as shown in FIG. 2. These will be described in detail in the next section. Although it is represented as a single quantum processor 5 in FIG. 1, there is no limitation to this, and it may be implemented so as to have a plurality of quantum processors 5 for each function. Moreover, it may be a combination thereof.

2. Functional Configuration

Figure 3:
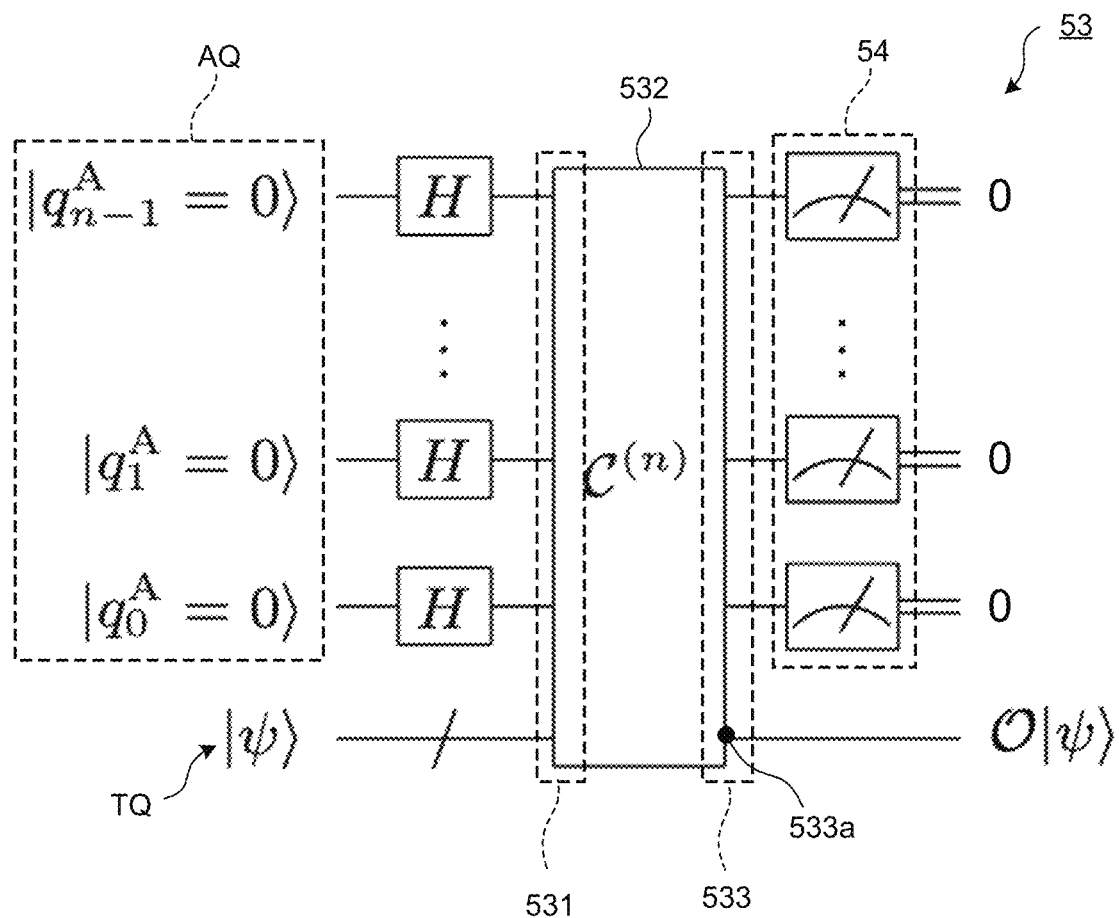
FIG. 3 shows the configuration of the quantum gate 53 (quantum circuit).

In this section, the functional configuration of the quantum computer 1 according to the present embodiment will be described. FIG. 2 is a block diagram showing a functional configuration of a quantum computer 1 (quantum processor 5). FIG. 3 shows the configuration of the quantum gate 53 (quantum circuit). Regarding the quantum processor 5 described above, the quantum computer 1 includes a setting unit 51, a processing unit 52, a quantum gate 53, an observation unit 54, a quantum phase estimation unit 55, and a specification unit 56. Hereinafter, each component will be further described.

(Setting Unit 51)

When the quantum computer 1 calculates the linear sum O of the unitary operators U, the linear sum O is defined by the number of terms being 2 to the n-th power. A term having a coefficient c of 0 is also included in this number of terms. The setting unit 51 is configured to set the parameter group $\{\theta\}$ of the n layers based on each coefficient c in the linear sum O of the unitary operators U. Here, the parameter group $\{\theta\}$ of the k-th ($2 \leq k \leq n$) layer is recursively set based on the parameter group $\{\theta\}$ of the (k−1)-th layer.

(Processing Unit 52)

The processing unit 52 executes various calculations calculated by the quantum computer 1. For instance, the processing unit 52 executes the four arithmetic operations included in the quantum calculation. Alternatively, the processing unit 52 may be configured so that the input value to be input to the quantum gate 53, which will be described later, can be initialized. For instance, the processing unit 52 can initialize the input value of the auxiliary qubit AQ by causing the Hadamard gate (H in FIG. 3) to act on all the qubits as an initial state. The input value of the initialized auxiliary qubit AQ has a plurality of levels with equal probability.

(Quantum Gate 53)

As shown in FIG. 3, the quantum gate 53 has n+m qubits including n auxiliary qubits AQ and m target qubits TQ. The quantum gate 53 is configured to perform a predetermined operation on the input value input to each qubit based on the parameter θ included in the parameter group $\{\theta\}$ of the n layers.

More specifically, the quantum gate 53 (quantum circuit) includes an input unit 531, a calculation unit 532, and an output unit 533 (particularly, a target qubit output unit 533a). The input unit 531 has n+m qubits including n auxiliary qubits AQ and m target qubits TQ. The calculation unit 532 is configured to execute a predetermined calculation on the input value input from the input unit 531 based on the parameter θ included in the parameter group $\{\theta\}$ of the n layers. The target qubit output unit 533a is configured to output the product of the input value input to the target qubit TQ and the linear sum O of the unitary operators U.

(Observation Unit 54)

The observation unit 54 observes an output value having a plurality of values probabilistically by quantum superposition for each qubit. By observing by the observation unit 54, the output value is determined to be one of a plurality of values. Specifically, the observation unit 54 is configured to observe the auxiliary output value which is the output value of the n auxiliary qubits AQ in the quantum gate 53. In this regard, as shown in FIG. 3, the quantum gate 53 is configured to output the product of the input value of the target qubit TQ and the linear sum O of the unitary operators U as the target output value which is the output value of the target qubit TQ when the auxiliary output value observed by the observation unit 54 is a certain value (for example, when all are 0).

More preferably, the quantum gate 53 outputs the product of the input value of the target qubit TQ and the first linear sum O1 of the unitary operators U as the first target output value when the observation unit 54 observes the auxiliary output value as 0. On the other hand, the quantum gate 53 outputs the product of the input value of the target qubit TQ and the second linear sum O2 of the unitary operators U as the second target output value when the observation unit 54 observes the auxiliary output value as 1. Here, the second linear sum O2 is the Hermitian conjugate of the first linear sum O1. This will be described in detail in the next section.

More preferably, the quantum gate 53 is configured to output the state of any quantum qubit by outputting the product of the input value of the target qubit TQ and the linear sum O of the unitary operators U as a standard output value when the observation unit 54 observes the auxiliary output value as 0. This will be described in detail in the next section.

(Quantum Phase Estimation Unit 55)

The quantum phase estimation unit 55 is configured to perform quantum phase estimation for the first and second target output values. The details will be illustrated in the next section as well.

(Specification Unit 56)

The specification unit 56 is configured to specify the linear sum O of the unitary operators U based on the calculation result of the quantum gate 53. Further, the specification unit 56 may be configured to specify a value or a function that depends on the linear sum O of the unitary operators U. For example, the specification unit 56 is configured to specify a predetermined function based on the result of the quantum phase estimation by the quantum phase estimation unit 55. Here, examples of the predetermined function include Green's function GF or linear response function LF.

3. Theory

In this section, the quantum mechanical theory regarding the above-mentioned functional configuration will be supplemented, and the quantum calculation method based on this will be illustrated.

3.1 Recursive Setting of Parameter Group $\{\theta\}$

As described in the previous section, the setting unit 51 recursively sets the parameter group $\{\theta\}$ so as to calculate the linear sum O of the unitary operators U. As a premise, regarding the linear sum O of the unitary operators U whose number of terms is defined by 2 to the n-th power, each coefficient c is sequentially identified using an index represented by an n-digit binary number. This is represented as in Equation 1.

[Equation 1]

$$O = c_{0\ldots 00} U_{0\ldots 00} + c_{0\ldots 01} U_{0\ldots 01} + \cdots + c_{1\ldots 11} U_{1\ldots 11} \qquad \text{Eqn. 1}$$

Subsequently, the parameter θ constituting the parameter group {θ} is defined based on each coefficient c. The phase factor of c_λ (λ is a subscript and represents a sequence of numbers 0 and 1) is set as θ_λ. (That is, c_λ=|c_λ| exp(iθ_λ).) Hereinafter, c_λ is retaken as |c_λ| and c_λ is a positive real number. Further, the parameter group {θ} has n layers, and the parameter group {θ} of the k-th layer includes 2 parameters θ^(k) raised to the n−k-th power. Here, as shown in Equation 2, the tangent of each parameter θ^(k) is expressed so as to depend on the ratio of a set of specific coefficients c. That is, the setting unit 51 determines the parameter θ^(k) included in the parameter group {θ} of the k-th layer so that the parameter θ^(k) depends on the ratio of a specific set of coefficients c out of each coefficient c.

[Equation 2]

$$\begin{cases} \tan\theta^{(1)}_{0\ldots00} = \dfrac{c_{0\ldots001}}{c_{0\ldots000}} \\ \tan\theta^{(1)}_{0\ldots01} = \dfrac{c_{0\ldots011}}{c_{0\ldots010}} \\ \quad\vdots \\ \tan\theta^{(1)}_{0\ldots11} = \dfrac{c_{1\ldots111}}{c_{1\ldots110}} \end{cases} \qquad \text{Eqn. 2}$$

Here, the specific set of coefficients c are two coefficients c having indices which differ from each other only in the k-th lowest digit, while the other digits coincide with each other. For instance, for the parameter θ included in the parameter group {θ} of the first layer, θ^(1)_{0 . . . 00} depends on the value obtained by dividing c_{0 . . . 001} by c_{0 . . . 000}. However, these coefficients c have the indices which differ from each other only in the lowest digit. Further, regarding the parameter θ included in the parameter group {θ} of the second layer, θ^(2)_{0 . . . 00} depends on the value obtained by dividing c_{0 . . . 010} by c_{0 . . . 000}. However, these coefficients c have the indices which differ from each other only in the second lowest digit (see Equation 3).

Figure 4:
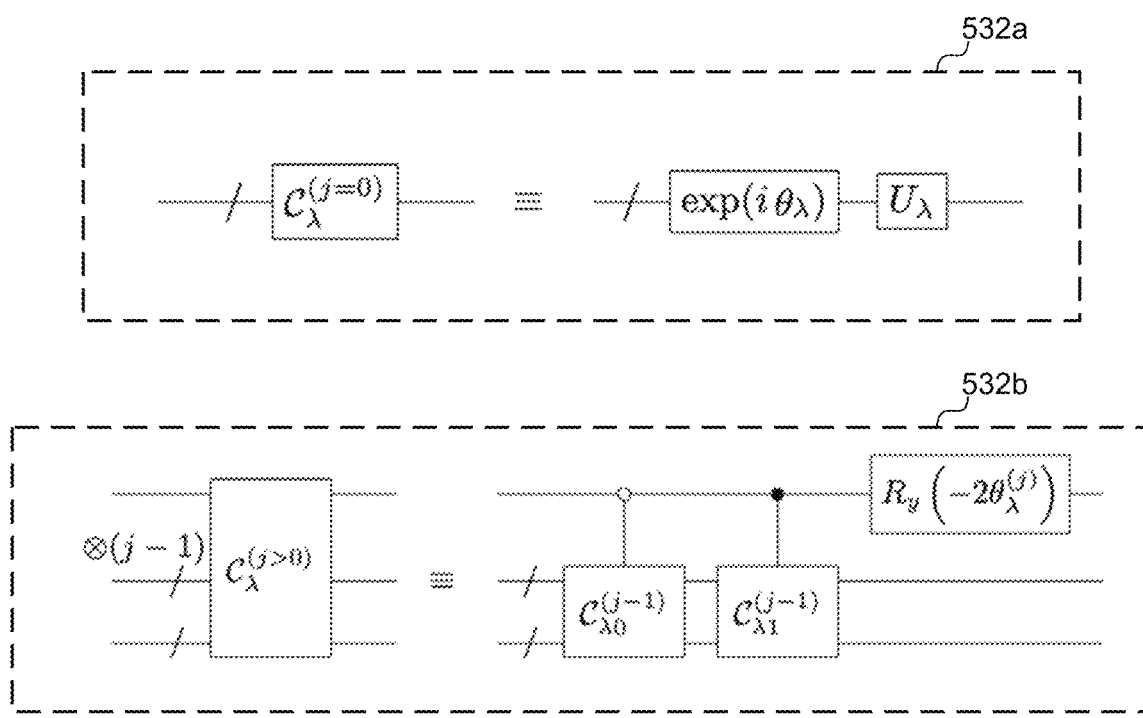
FIG. 4 is a circuit diagram showing processing of a parameter group {θ}.

FIG. 4 is a circuit diagram showing the processing of the parameter group {θ}. j in FIG. 4 may be considered as j=k+1. H is a Hadamard gate that performs the Hadamard transform. R is a rotation operator of the Bloch sphere and is represented by Ry(−2θ)=exp(iθσ_y). U is a unitary operator that performs unitary transformation. The black circle causes the value of the corresponding target qubit (generally meant here) to perform a predetermined operation when the input value of the control qubit is 1, and does not manipulate the value of the corresponding target qubit when the input value of the control qubits 0. The white circle causes the value of the corresponding target qubit to perform a predetermined operation when the input value of the control qubits 0, and does not manipulate the value of the corresponding target qubit when the input value of the control qubits 1. The coefficient c related to the parameter θ^(1) of the first layer is represented by the equivalent circuit 532*a* when regarded as a gate operation. The coefficient c related to the parameter θ^(k) of the second and subsequent layers is represented by using the coefficient c related to the parameter θ^(k−1) of the next lower layer when regarded as a gate operation. Specifically, it is defined as in Equation 3.

[Equation 3]

$$\begin{cases} \dfrac{\cos\theta^{(1)}_{0\ldots001}}{\cos\theta^{(1)}_{0\ldots000}}\tan\theta^{(2)}_{0\ldots00} = \dfrac{c_{0\ldots010}}{c_{0\ldots0000}} \\ \dfrac{\cos\theta^{(1)}_{0\ldots011}}{\cos\theta^{(1)}_{0\ldots010}}\tan\theta^{(2)}_{0\ldots01} = \dfrac{c_{0\ldots0110}}{c_{0\ldots0100}} \\ \quad\vdots \\ \dfrac{\cos\theta^{(1)}_{1\ldots111}}{\cos\theta^{(1)}_{1\ldots110}}\tan\theta^{(2)}_{1\ldots11} = \dfrac{c_{1\ldots1110}}{c_{1\ldots1100}} \end{cases} \qquad \text{Eqn. 3}$$

Regarding Equation 3, assuming that the parameter θ included in the parameter group {θ} of the k-th layer is identified in order by using an index represented by an (n−k)-digit binary number, the setting unit 51 sets the parameter θ so that a first parameter θ^(k) included in the parameter group of the k-th layer depends on the ratio of cosines for a particular set of the second parameters θ^(k−1) included in the parameter group {θ} of the (k−1)-th layer. Here, the particular set of the second parameters θ^(k−1) consists of two parameters θ, each of which has an index with 0 or 1 appended to the end of that of the first parameter θ^(k).

The setting of such a parameter group {θ} is represented as in Equation 4.

$$\underbrace{|q^4_{n-1}=0\rangle\otimes|0\rangle^{\otimes(n-1)}}_{Ancillae} \otimes \underbrace{|\psi\rangle}_{Input} \overset{H_n}{\mapsto} \qquad \text{Eqn. 4}$$

$$\dfrac{|0\rangle+|1\rangle}{\sqrt{2}}\otimes H_{n-1}|\Phi_{n-1}\rangle \overset{CC^{(n-1)}_0\text{ and }CC^{(n-1)}_1}{\longmapsto} \dfrac{|0\rangle}{\sqrt{2}}\otimes C^{(n-1)}_0 H_{n-1}|\Phi_{n-1}\rangle$$

$$+\dfrac{|1\rangle}{\sqrt{2}}\otimes C^{(n-1)}_1 H_{n-1}|\Phi_{n-1}\rangle \overset{R_y}{\mapsto} \dfrac{|0,\theta^{(n)}\rangle}{\sqrt{2}}\otimes C^{(n-1)}_0 H_{n-1}|\Phi_{n-1}\rangle$$

$$+\dfrac{|1,\theta^{(n)}\rangle}{\sqrt{2}}\otimes C^{(n-1)}_0 H_{n-1}|\Phi_{n-1}\rangle$$

Further, when this is recursively expanded, it is expressed as in Equation 5 when all the auxiliary output values of the auxiliary qubits AQ are observed to be 0.

[Equation 5]

$$C^{(n)}H_n|\Phi_n\rangle = |0\rangle^{\otimes n}\otimes \qquad \text{Eqn. 5}$$

$$\dfrac{1}{2^{n/2}}\big[\cos\theta^{(n)}\cos\theta^{(n-1)}_0\cos\theta^{(n-2)}_{00}\cdots\cos\theta^{(2)}_{0\ldots0}\cos\theta^{(1)}_{0\ldots00}U_{0\ldots000} +$$

$$\cos\theta^{(n)}\cos\theta^{(n-1)}_0\cos\theta^{(n-2)}_{00}\cdots\cos\theta^{(2)}_{0\ldots0}\sin\theta^{(1)}_{0\ldots00}U_{0\ldots001} +$$

$$\vdots$$

$$\sin\theta^{(n)}\sin\theta^{(n-1)}_1\sin\theta^{(n-2)}_{11}\cdots\sin\theta^{(2)}_{1\ldots1}\cos\theta^{(1)}_{1\ldots11}U_{1\ldots110} +$$

$$\sin\theta^{(n)}\sin\theta^{(n-1)}_1\sin\theta^{(n-2)}_{11}\cdots\sin\theta^{(2)}_{1\ldots1}\sin\theta^{(1)}_{1\ldots11}U_{1\ldots111}\big]|\psi\rangle +$$

(terms involving other ancillary states)

That is, the unitary transformation of the k-th layer is recursively represented by the unitary transformation of the (k−1)-th layer. More specifically, the unitary transformation of the k-th layer is determined as follows. Referring to FIG. 4, the auxiliary qubit AQ0 to the auxiliary qubit AQ(k−1) are set to the input values 0, respectively, and the initialization state in which 0 and 1 are superpositioned as the basis is realized through the Hadamard gate. Next, when the auxiliary qubit AQ(k−1) is 0, the first unitary transformation of the (k−1)-th layer for the auxiliary qubit AQ0 to the auxiliary qubit AQ(k−2) and m target qubits is executed. Subsequently, when the auxiliary qubit AQ(k−1) is 1, the second unitary transformation of the (k−1)-th layer for the auxiliary qubit AQ0 to the auxiliary qubit AQ(k−2) and m target qubits is executed. Here, in the first unitary transformation and the second unitary transformation, their indices differ from each other only in the lowermost digit. Finally, the rotation by the rotation operator Ry of $\theta\char`\^(k)$ is executed for the auxiliary qubit AQ(k−1).

In other words, the quantum gate 53 includes n layers control unitary gate. The control unitary gate of the k-th ($2 \leq k \leq n$) layer inputs one control qubit, k−1 controlled qubits, and m target qubits. A first and second control unitary gates of the (k−1)-th layer and a rotation gate are provided. The first control unitary gate is configured to operate the values of the controlled qubit and the target qubit when the value of the control qubits 0. The second control unitary gate is configured to operate the values of the controlled qubit and the target qubit when the value of the control qubits 1. The rotation gate applies on the control qubit.

3.2 Interpretation of a Simple Model

Figure 5:
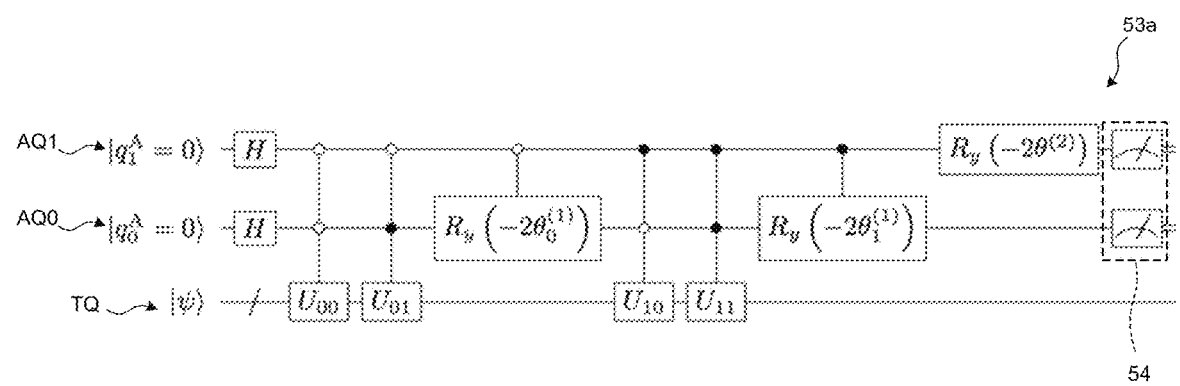
FIG. 5 is a circuit diagram showing processing of a parameter group {θ} when n=2.

Next, consider the case of n=2 with reference to FIG. 5. FIG. 5 is a circuit diagram showing processing of the parameter group $\{\theta\}$ when n=2. The linear sum O of the four unitary operators U included in FIG. 5 is shown in Equation 6.

[Equation 6]

$$O = c_{00}U_{00} + c_{01}U_{01} + c_{10}U_{10} + c_{11}U_{11} \quad \text{Eqn. 6}$$

As shown in FIG. 5, the quantum gate 53a has two auxiliary qubits AQ and m target qubits TQ. In this quantum circuit, the parameter group $\{\theta\}$ includes the parameter group $\{\theta\}$ of the first layer and the parameter group $\{\theta\}$ of the second layer. The parameter group $\{\theta\}$ of the first layer includes $\theta^{(1)}\_\{0\}$ and $\theta^{(1)}\_\{1\}$. Then, the tangent of $\theta^{(1)}\_\{0\}$ is defined by the value of $c\_\{01\}$ divided by $c\_\{00\}$. The tangent of $\theta^{(1)}\_\{1\}$ is defined by the value of $c\_\{11\}$ divided by $c\_\{10\}$. The parameter group $\{\theta\}$ of the second layer includes $\theta^{(2)}$ and has no index. Then, the product of the tangent of $\theta^{(2)}$ and the ratio of cosines string for $\theta^{(1)}\_\{0\}$ and $\theta^{(1)}\_\{1\}$ is defined by the value of $c\_\{10\}$ divided by $c\_\{00\}$. That is, as shown in Equation 7, $\theta^{(2)}$ included in the parameter group $\{\theta\}$ of the second layer is recursively set by $\theta^{(1)}\_\{0\}$ and $\theta^{(1)}\_\{1\}$ included in the parameter group $\{\theta\}$ of the first layer.

[Equation 7]

$$\begin{cases} \tan\theta_0^{(1)} = \dfrac{c_{01}}{c_{00}} \\ \tan\theta_1^{(1)} = \dfrac{c_{11}}{c_{10}} \\ \dfrac{\cos\theta_1^{(1)}}{\cos\theta_0^{(1)}} \tan\theta^{(2)} = \dfrac{c_{10}}{c_{00}} \end{cases} \quad \text{Eqn. 7}$$

In such a quantum circuit, when all the auxiliary output values in the two auxiliary qubits AQ are observed to be 0, the target output value in the target qubits TQ is the product of the input value of the target qubit TQ and the linear sum O of the unitary operators U shown in Equation 6.

More specifically, referring to FIG. 5, the auxiliary qubit AQ0 and the auxiliary qubit AQ1 are set to the input values 0, respectively, and the initialization state in which 0 and 1 are superpositioned as the basis is realized through the Hadamard gate. Next, when the auxiliary qubit AQ1 is 0 and the auxiliary qubit AQ0 is 0, unitary transformation by the unitary operators U_{00} is executed for the target qubit TQ. Then, when the auxiliary qubit AQ1 is 0 and the auxiliary qubit AQ0 is 1, unitary transformation by the unitary operators U_{01} is executed for the target qubit TQ. Subsequently, when the auxiliary qubit AQ1 is 0, the rotation by the rotation operator Ry of $\theta\char`\^(1)\_0$ is executed for the auxiliary qubit AQ0.

Subsequently, unitary transformation by the unitary operators U_{10} is executed for the target qubits TQ when the auxiliary qubit AQ1 is 1 and the auxiliary qubit AQ0 is 0. Then, unitary transformation by the unitary operators U_{11} is executed for the target qubit TQ when the auxiliary qubit AQ1 is 1 and the auxiliary qubit AQ0 is 1. Next, the rotation by the rotation operator Ry of $\theta\char`\^(1)\_1$ is executed for the auxiliary qubit AQ0 when the auxiliary qubit AQ1 is 1.

Finally, the rotation by the rotation operator Ry of $\theta\char`\^(2)$ is executed for the auxiliary qubit AQ1.

To summarize the above, this quantum calculation method includes a setting step, a calculation step, and a specification step. In the setting step, the parameter group $\{\theta\}$ of the n layers is set based on each coefficient in the linear sum O of the unitary operators whose number is 2 to the n-th power. In the calculation step, a predetermined calculation is executed for the input value input to each qubit based on the parameter θ included in the parameter group $\{\theta\}$ of the n layers. In the specific step, the linear sum O of the unitary operators U is specified based on the calculation result in the calculation step.

Preferably, this quantum calculation method further comprises an observation step. The observation step observes the auxiliary output value which is the output value of n auxiliary qubits AQ in the quantum gate 53. The calculation step outputs the product of the input value of the target qubit TQ and the linear sum O of the unitary operators U as the target output value which is the output value of the target qubit TQ when all the auxiliary output values observed in the observation step are 0.

3.3 Application to the Derivation of Green's Function GF

Figure 6:
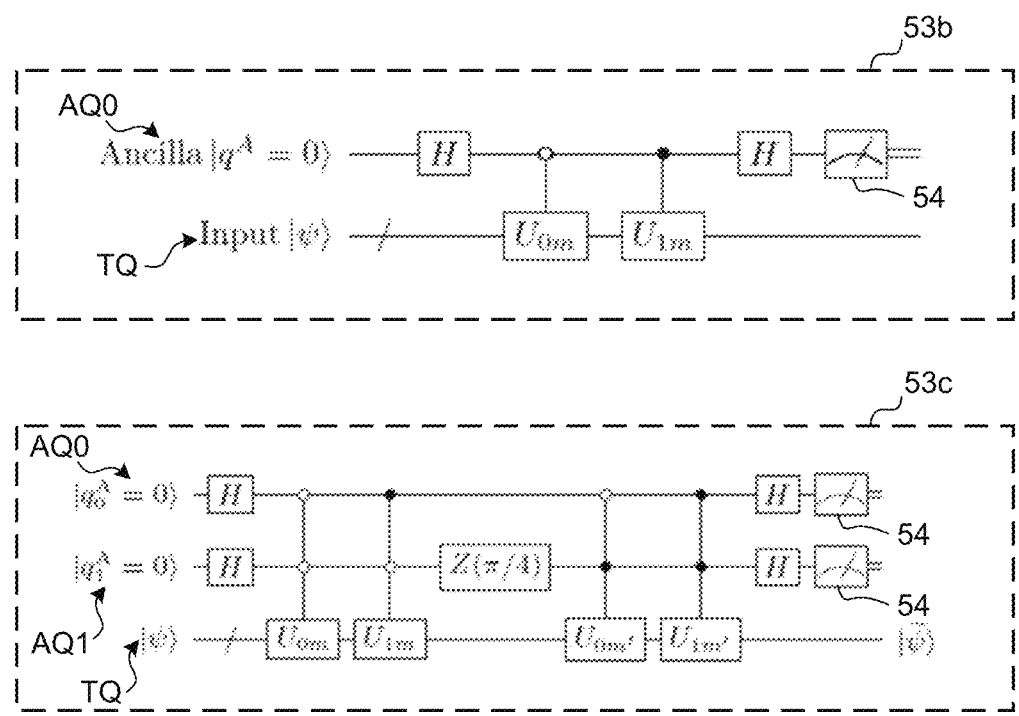
FIG. 6 is a circuit diagram for deriving the electronic creation operator a + and the annihilation operator a of the Green's function GF.

By making it possible to derive the linear sum O of the unitary operators U described above, values and functions that depend on the linear sum O of the unitary operators U can be specified. Here, the Green's function GF will be described as an example. Once the Green's function GF is obtained, it becomes possible to calculate the quasiparticle band structure (orbital energy). In order to calculate the Green's function, it is necessary to prepare a state in which the electronic creation operator a+ (here, "+" is a dagger) and the annihilation operator a act on the basis electronic state. FIG. 6 is a circuit diagram for deriving the diagonal and off-diagonal components of the Green's function GF.

The Green's function GF is defined by Equation 8.

[Equation 8]

$$G(z) = G^{(e)}(z) + G^{(h)}(z) \quad \text{Eqn. 8}$$

In Equation 8, the first term is the electronic part and the second term is the hole part. Further, the electronic part of the first term is represented by Equation 9, and the hole part of the second term is represented by Equation 10.

[Equation 9]

$$G_{mm'}^{(e)}(z) = \langle \Psi_{gs}^N | a_m \frac{1}{z + \varepsilon_{gs}^N - \mathcal{H}} a_{m'}^\dagger | \Psi_{gs}^N \rangle = \sum_{\lambda \in N+1} \frac{\langle \Psi_{gs}^N | a_m | \Psi_\lambda^{N+1} \rangle \langle \Psi_\lambda^N | a_{m'}^\dagger | \Psi_{gs}^N \rangle}{z + \varepsilon_{gs}^N - \varepsilon_\lambda^{N+1}} \quad \text{Eqn. 9}$$

[Equation 10]

$$G_{mm'}^{(h)}(z) = \langle \Psi_{gs}^N | a_{m'}^\dagger \frac{1}{z - \varepsilon_{gs}^N + \mathcal{H}} a_m | \Psi_{gs}^N \rangle = \sum_{\lambda \in N-1} \frac{\langle \Psi_{gs}^N | a_{m'}^\dagger | \Psi_\lambda^{N-1} \rangle \langle \Psi_\lambda^{N-1} | a_m | \Psi_{gs}^N \rangle}{z + \varepsilon_\lambda^{N-1} - \varepsilon_{gs}^N} \quad \text{Eqn. 10}$$

In particular, a+ in Equation 9 and a in Equation 10 are electronic creation operator and annihilation operator, respectively. In a quantum computer, the above definition formula cannot be calculated as it is. Specifically, even if the wave function in the basis state shown in Equation 11 can be calculated, it is difficult to calculate the state of the Equation 12 which is the product of the wave function and the creation operator a+ or the state of the Equation 13 which is the product of the annihilation operator a in a realistic calculation time.

[Equation 11]

$$|\Psi_{gs}^N\rangle \quad \text{Eqn. 11}$$

[Equation 12]

$$a_m^\dagger |\Psi_{gs}^N\rangle \quad \text{Eqn. 12}$$

[Equation 13]

$$a_m |\Psi_{gs}^N\rangle \quad \text{Eqn. 13}$$

Since the electronic creation operator a+ is a Hermitian conjugate of the electronic annihilation operator a, the unitary operators U as shown in Equation 14 can be defined by taking the sum or difference thereof.

[Equation 14]

$$\begin{cases} a^\dagger + a = \hat{U}_0 \\ i(a - a^\dagger) = \hat{U}_1 \end{cases} \quad \text{Eqn. 14}$$

When this is solved for the creation operator a+ and the annihilation operator a, the creation operator a+ and the annihilation operator a are represented as the linear sum O of the unitary operator U, respectively. In other words, the first linear sum O1 is the electronic annihilation operator a in a predetermined function (Green's function GF), and the second linear sum O2 is the electronic creation operator a+ in a predetermined function.

[Equation 15]

$$\begin{cases} a^\dagger = \frac{1}{2}(\hat{U}_0 - i\hat{U}_1) \\ a = \frac{1}{2}(\hat{U}_0 + i\hat{U}_1) \end{cases} \quad \text{Eqn. 15}$$

That is, by applying the above-mentioned quantum gate 53, the electronic creation operator a+ and the electronic annihilation operator a can be derived. Specifically, it is preferable to define the quantum gate 53b for the diagonal component and the quantum gate 53c for the off-diagonal component. In particular, the diagonal components are represented as in Equation 16.

[Equation 16]

$$|0\rangle \otimes |\psi\rangle \mapsto |0\rangle \otimes \frac{U_{0m} + U_{1m}}{2}|\psi\rangle + |1\rangle \otimes \frac{U_{0m} - U_{1m}}{2}|\psi\rangle = |0\rangle \otimes a_m |\psi\rangle + |1\rangle \otimes a_m^\dagger |\psi\rangle \equiv |\Phi_m\rangle \quad \text{Eqn. 16}$$

That is, when the auxiliary output value of the auxiliary qubit AQ is observed to be 0, the product (Equation 13) of the input value of the target qubit TQ (wave function shown in Equation 11) and the electronic annihilation operator a is output (first target output value). When the auxiliary output value of the auxiliary qubit AQ is observed to be 1, the product (Equation 12) of the input value of the target qubit TQ (Equation 11) and the electronic creation operator a is output (second target output value). That is, regardless of whether the auxiliary output value of the auxiliary qubit AQ is 0 or 1 here, a value useful for deriving the Green's function GF is output as the target output value.

Figure 7:
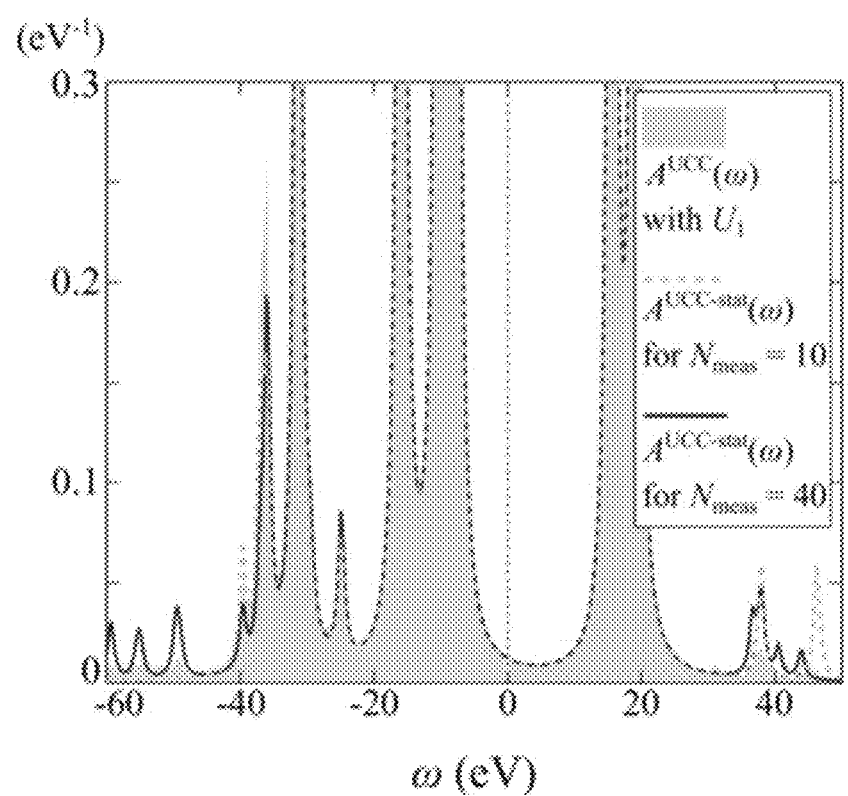
FIG. 7 is a graph showing the calculation result of the quasiparticle spectrum of the H_2O molecule.

Furthermore, by applying quantum phase estimation, which is an algorithm for quantum calculation of the eigenvalues of the unitary matrix, to the obtained Equations 12 and 13, each part of the Green's function GF can be derived as represented by Equations 9 and 10. Further, by applying Equation 17 to the Green's function GF, a quasiparticle spectrum can be obtained as shown in FIG. 7. FIG. 7 is a graph showing the calculation result of the quasiparticle spectrum of the H_2O molecule.

[Equation 17]

$$A(\omega) = -\frac{1}{\pi} \text{Im}[tr(G(\omega + i\delta))] \quad \text{Eqn. 17}$$

To summarize the above, preferably, in this quantum calculation method, in the calculation step, when the auxiliary output value is observed as 0 in the observation step, the input value of the target qubit TQ and the first linear sum O1 of the unitary operators U The product of and is output as the first target output value. In the calculation step, when the auxiliary output value is observed as 1 in the observation step, the product of the input value of the target qubit TQ and the second linear sum O2 of the unitary operators U is output as the second target output value.

More preferably, this quantum calculation method further comprises a quantum phase estimation step. In the quantum phase estimation step, quantum phase estimation is performed for the first and second target output values. In the specification step, a predetermined function is specified based on the result of quantum phase estimation.

More specifically, referring to the quantum gate 53b (diagonal component) in FIG. 6, the auxiliary qubit AQ0 is set to the input value 0, and the initialization state in which 0 and 1 are superpositioned as the basis through the Hadamard gate is realized. Next, unitary transformation by the unitary operators U_{0m} is executed when the auxiliary qubit AQ0 is 0. Subsequently, when the auxiliary qubit AQ0 is 1, unitary transformation by the unitary operators U_{1m} is executed. After that, the observation of the output value is executed for the auxiliary qubit AQ0 through the Hadamard gate again.

With reference to the quantum gate 53c (off-diagonal component) in FIG. 6, the auxiliary qubit AQ0 and the auxiliary qubit AQ1 are set to the input values 0, respectively, and the initialization state in which 0 and 1 are superpositioned as the basis through the Hadamard gate is realized. Next, unitary transformation by the unitary operators U_{0m} is executed for the target qubit TQ when the auxiliary qubit AQ1 is 0 and the auxiliary qubit AQ0 is 0. Subsequently, when the auxiliary qubit AQ1 is 0 and the auxiliary qubit AQ0 is 1, unitary transformation by the unitary operators U_{1m} is executed for the target qubit TQ. Subsequently, a rotation of the phase π/4 is executed for the auxiliary qubit AQ1.

Subsequently, when the auxiliary qubit AQ1 is 1 and the auxiliary qubit AQ0 is 0, unitary transformation by the unitary operators U_{0m'} is executed for the target qubit TQ. Subsequently, when the auxiliary qubit AQ1 is 1 and the auxiliary qubit AQ0 is 1, unitary transformation by the unitary operators U_{1m'} is executed for the target qubit TQ.

After that, the observation of the output value is executed for the auxiliary qubit AQ1 and the auxiliary qubit AQ0 through the Hadamard gate again.

3.4 Application to the Derivation of the Linear Response Function LF

Figure 8:
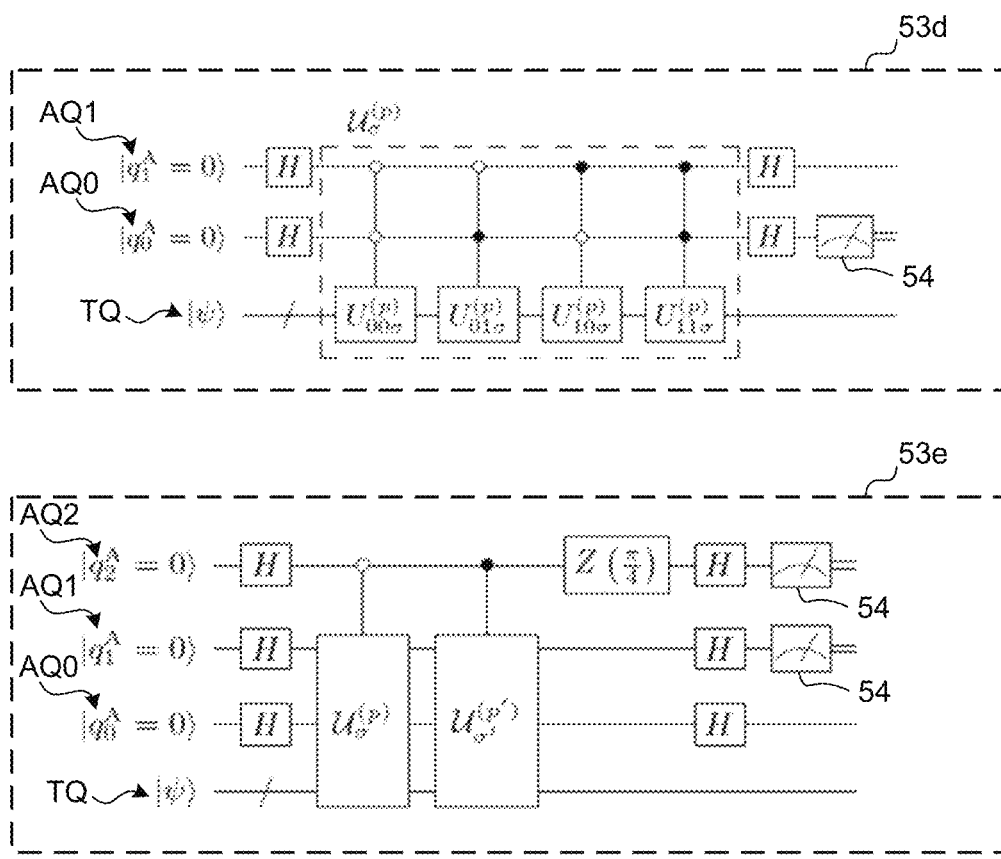
FIG. 8 is a circuit diagram for deriving the electronic density operator n of the linear response function LF.
Figure 9:
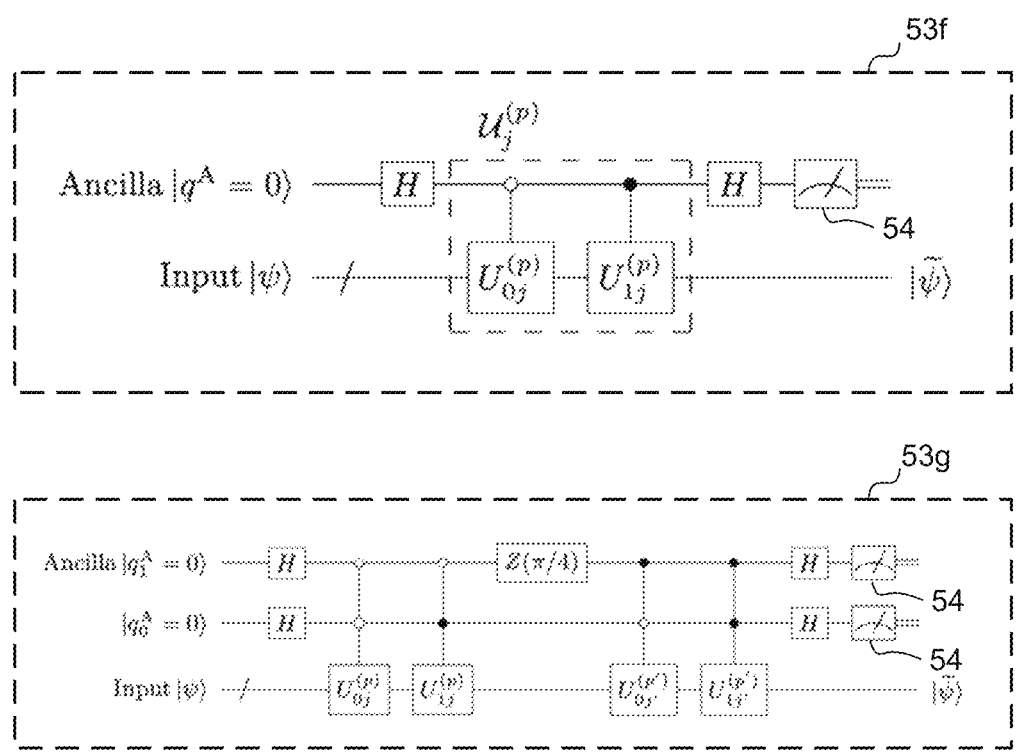
FIG. 9 is a circuit diagram for deriving the spin density operator s of the linear response function LF.

Next, the linear response function LF, which is frequently used in material calculation, will be described as an example. FIG. 8 is a circuit diagram for deriving the electronic density operator n of the linear response function LF. FIG. 9 is a circuit diagram for deriving the spin density operator s of the linear response function LF.

The linear response function LF includes a spin spin-spin response function LF1 (Equation 18), a charge-charge response function LF2 (Equation 19), and a charge-spin response function LF3 (Equation 20).

[Equation 18]

$$L_{\lambda pj,p'j'} \equiv S_{\lambda pj,p'j'} \equiv \langle \Psi_{gs}|s_{pj}|\Psi_\lambda\rangle\langle\Psi_\lambda|s_{p'j'}|\Psi_{gs}\rangle \quad \text{Eqn. 18}$$

[Equation 19]

$$L_{\lambda pn,p'n} \equiv \sum_{\sigma,\sigma'=\alpha,\beta} N_{\lambda p\sigma,p'\sigma'} \quad \text{Eqn. 19}$$

$$\left(N_{\lambda p\sigma,p'\sigma'} \equiv \langle\Psi_{gs}|n_{p\sigma}|\Psi_\lambda\rangle\langle\Psi_\lambda|n_{p'\sigma'}|\Psi_{gs}\rangle\right)$$

[Equation 20]

$$L_{\lambda pn,p'n} \equiv \sum_{\sigma=\alpha,\beta} M_{\lambda pj,p'\sigma} \quad \text{Eqn. 20}$$

$$\left(M_{\lambda pj,p'\sigma'} \equiv \langle\Psi_{gs}|s_{pj}|\Psi_\lambda\rangle\langle\Psi_\lambda|n_{p'\sigma'}|\Psi_{gs}\rangle \equiv M^*_{\lambda p'\sigma',pj}\right)$$

Further, the electronic density operator n and the spin density operator s are represented as in Equation 21.

[Equation 21]

$$\begin{cases} n_{p\sigma} = a^\dagger_{p\sigma}a_{p\sigma} \\ s_{px} = \dfrac{a^\dagger_{p\alpha}a_{p\beta} + a^\dagger_{p\beta}a_{p\alpha}}{2} \\ s_{py} = \dfrac{-ia^\dagger_{p\alpha}a_{p\beta} + ia^\dagger_{p\beta}a_{p\alpha}}{2} \\ s_{pz} = \dfrac{a^\dagger_{p\alpha}a_{p\alpha} - a^\dagger_{p\beta}a_{p\beta}}{2} \end{cases} \quad \text{Eqn. 21}$$

Here, the charge-charge response function LF2 will be further described as an example. Same as the Green's function GF described above, the electronic creation operator a+ and the electronic annihilation operator a can be represented by the linear sum O of the unitary operators U as shown in Equation 22.

[Equation 22]

$$\begin{cases} a^\dagger_{p\sigma} = \dfrac{U_{0p\sigma} - U_{1p\sigma}}{2} \\ a_{p\sigma} = \dfrac{U_{0p\sigma} + U_{1p\sigma}}{2} \end{cases} \quad \text{Eqn. 22}$$

Here the unitary operators U as shown in Equation 23 is newly defined.

[Equation 23]

$$U_{\kappa\kappa'\sigma}^{(p)} = U_{\kappa p\sigma}U_{\kappa'p\sigma}(\kappa,\kappa'=0,1) \quad \text{Eqn. 23}$$

By using the Equation 23, the electronic density operator n can be expressed as the Equation 24.

[Equation 24]

$$n_{p\sigma} = a^\dagger_{p\sigma}a_{p\sigma} = \quad \text{Eqn. 24}$$

$$\dfrac{U_{0p\sigma} - U_{1p\sigma}}{2}\dfrac{U_{0p\sigma} + U_{1p\sigma}}{2} = \dfrac{U^{(p)}_{00\sigma} + U^{(p)}_{01\sigma} - U^{(p)}_{10\sigma} - U^{(p)}_{11\sigma}}{4}$$

The quantum gate 53 for calculating the linear sum O of such a unitary operators U is shown in FIG. 8. Specifically, it is preferable to define the quantum gate 53d for the diagonal component and the quantum gate 53e for the off-diagonal component. In particular, the diagonal components are represented as in Equation 25.

[Equation 25]

$$\underbrace{|q_1^A = 0\rangle \otimes |q_0^A = 0\rangle}_{\text{Ancilla}} \otimes \underbrace{|\psi\rangle}_{\text{Register}} \mapsto | \quad \text{Eqn. 25}$$

$$|0\rangle \otimes |0\rangle \otimes \underbrace{\dfrac{U^{(p)}_{00\sigma} + U^{(p)}_{01\sigma} + U^{(p)}_{10\sigma} + U^{(p)}_{11\sigma}}{4}}_{=0}|\psi\rangle +$$

$$|0\rangle \otimes |1\rangle \otimes \underbrace{\dfrac{U^{(p)}_{00\sigma} - U^{(p)}_{01\sigma} + U^{(p)}_{10\sigma} - U^{(p)}_{11\sigma}}{4}}_{=\tilde{n}_{p\sigma}}|\psi\rangle + |1\rangle \otimes |$$

-continued $$|0\rangle \otimes \underbrace{\frac{U_{00\sigma}^{(p)} + U_{01\sigma}^{(p)} - U_{10\sigma}^{(p)} - U_{11\sigma}^{(p)}}{4}}_{n_{p\sigma}} |\psi\rangle + |1\rangle |1\rangle \otimes$$

$$\underbrace{\frac{U_{00\sigma}^{(p)} - U_{01\sigma}^{(p)} - U_{10\sigma}^{(p)} + U_{11\sigma}^{(p)}}{4}}_{=0} |\psi\rangle = |0\rangle \otimes |1\rangle \otimes \tilde{n}_{p\sigma} |$$

$$\psi\rangle + |1\rangle \otimes |0\rangle \otimes n_{p\sigma} |\psi\rangle \equiv |\Phi_{p\sigma}\rangle = 1 - n_{p\sigma}$$

Further, the charge-charge response function LF2 (Equation 19) can be derived by applying the quantum phase estimation as same as in the case of obtaining the Green's function GF. Further, by applying Equation 26, a light absorption spectrum can be obtained.

[Equation 26]

$$\sigma(\omega) = -\frac{4\pi}{c} \mathrm{Im} Tr \chi(\omega) \qquad \text{Eqn. 26}$$

Of course, since the spin density operator s can also be represented by the linear sum O of the unitary operators U, the spin-spin response function LF1 can be derived by performing quantum computation as the same as in the case of the electronic density operator n.

More specifically, referring to the quantum gate 53*d* (diagonal component) in FIG. 8, the auxiliary qubit AQ0 and the auxiliary qubit AQ1 are set to the input values 0, respectively, and the initialization state in which 0 and 1 are superpositioned as the basis is realized through the Hadamard gate. Next, when the auxiliary qubit AQ1 is 0 and the auxiliary qubit AQ0 is 0, unitary transformation by the unitary operators U_{00σ} is executed for the target qubit TQ. Then, when the auxiliary qubit AQ1 is 0 and the auxiliary qubit AQ0 is 1, unitary transformation by the unitary operators U_{01σ} is executed for the target qubit TQ. Then, when the auxiliary qubit AQ1 is 1 and the auxiliary qubit AQ0 is 0, unitary transformation by the unitary operators U_{10σ} is executed for the target qubit TQ. Subsequently, when the auxiliary qubit AQ1 is 1 and the auxiliary qubit AQ0 is 1, unitary transformation by the unitary operators U_{11σ} is executed for the target qubit TQ.

After that, the observation of the output value is executed for the auxiliary qubit AQ1 and the auxiliary qubit AQ0 through the Hadamard gate again.

Referring to the quantum gate 53*e* (off-diagonal component) of FIG. 8, the auxiliary qubit AQ0 to the auxiliary qubit AQ2 are set to the input values 0, respectively, and the initialization state in which 0 and 1 are superpositioned as the basis is realized through the Hadamard gate. Next, when the auxiliary qubit AQ2 is 0, the first unitary transformation is executed for the auxiliary qubit AQ0, the auxiliary qubit AQ1, and the target qubit TQ. Next, when the auxiliary qubit AQ2 is 1, the second unitary transformation is executed for the auxiliary qubit AQ0, the auxiliary qubit AQ1, and the target qubit TQ. Subsequently, a rotation of the phase π/4 is executed for the auxiliary qubit AQ2.

After that, the observation of the output value is executed for the auxiliary qubits AQ0 to AQ2 through the Hadamard gate again.

Figure 10:
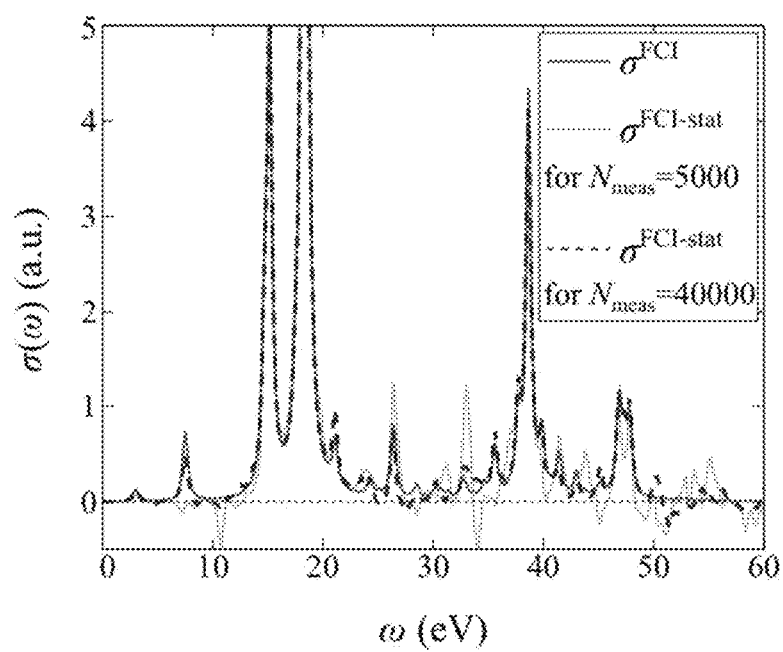
FIG. 10 is a graph showing a calculation result of a light absorption spectrum of a C_2 molecule.

The quantum gate 53 used when deriving the spin-spin response function LF1 is referred to FIG. 9. Specifically, the quantum gate 53*f* is defined for the diagonal component, and the quantum gate 53*g* is defined for the off-diagonal component. Further, the charge-spin response function LF3 can be derived by the electronic density operator n and the spin density operator s. Furthermore, by using such a linear response function LF, the light absorption spectrum can be obtained as shown in FIG. 10. FIG. 10 is a graph showing the calculation result of the light absorption spectrum of the C_2 molecule.

According to such a quantum calculation method described in this section, the linear sum of the unitary operators can be calculated with quantization, thus physical quantities and physical functions including the linear sum of unitary operators can be calculated instead of the classical algorithm in such a quantum computer. Can be calculated. That is, it is possible to calculate the linear sum of the unitary operators, physical quantities and physical functions including the linear sum of the unitary operators faster than the conventional technique using the classical algorithm.

3.5 Creation of Oracle

By using n qubits, it is possible to take $2^n$ linear combinations of different states. The state of n qubits can be specified only by specifying $2^n$ degrees of freedom. In other words, the state of n qubits can hold $2^n$ pieces of information at one time.

In n qubits, each qubit can be in a superposition state (taken at the same time) of 0 and 1. The state of n qubits can be represented as a superposition state of $2^n$ states because each qubit can take two states of 0 and 1. Further, the $2^n$ coefficients representing the weights of each state are generally complex numbers. The method of arbitrarily controlling $2^n$ coefficients is called oracle, which is an important elemental technique in quantum technology.

Here, the realization of oracle is represented by using the linear sum O of the unitary operators U described above. As shown in Equation 27, the state of n qubits can generally be represented as the linear combination of $2^n$ states. This coefficient is set as c.

[Equation 27]

$$|\Psi\rangle = c_{0\ldots00}|0\ldots00\rangle + c_{0\ldots01}|0\ldots01\rangle + \ldots + c_{1\ldots11}|1\ldots11\rangle \qquad \text{Eqn. 27}$$

Subsequently, Equation 27 is transformed into Equation 28 by using the operators.

[Equation 28]

$$|\Psi\rangle = (c_{0\ldots00}\hat{U}_{0\ldots00} + c_{0\ldots01}\hat{U}_{0\ldots01} + \ldots + c_{1\ldots11}\hat{U}_{0\ldots11})|\alpha\rangle \qquad \text{Eqn. 28}$$

Here, the operator {U_λ} in Equation 28 (λ is a number sequence in which n 0s and 1s are arranged) is defined as Equation 29. In other words, it is defined as a unitary operator that acts on the state of a certain quantum qubit string a and converts it into the state of a quantum qubit string called λ.

[Equation 29]

$$\hat{U}_{0\ldots00}|\alpha\rangle = |0\ldots00\rangle \qquad \text{Eqn. 29}$$

$$\vdots$$

$$\hat{U}_{1\ldots11}|\alpha\rangle = |1\ldots11\rangle$$

Here, Equation 28 means that the oracle can be written as a linear combination of the unitary operator {U_λ}. That is, it means that an arbitrary oracle can be created by using the sum formula related to the linear sum O of the unitary operators U described above.

Figure 11:
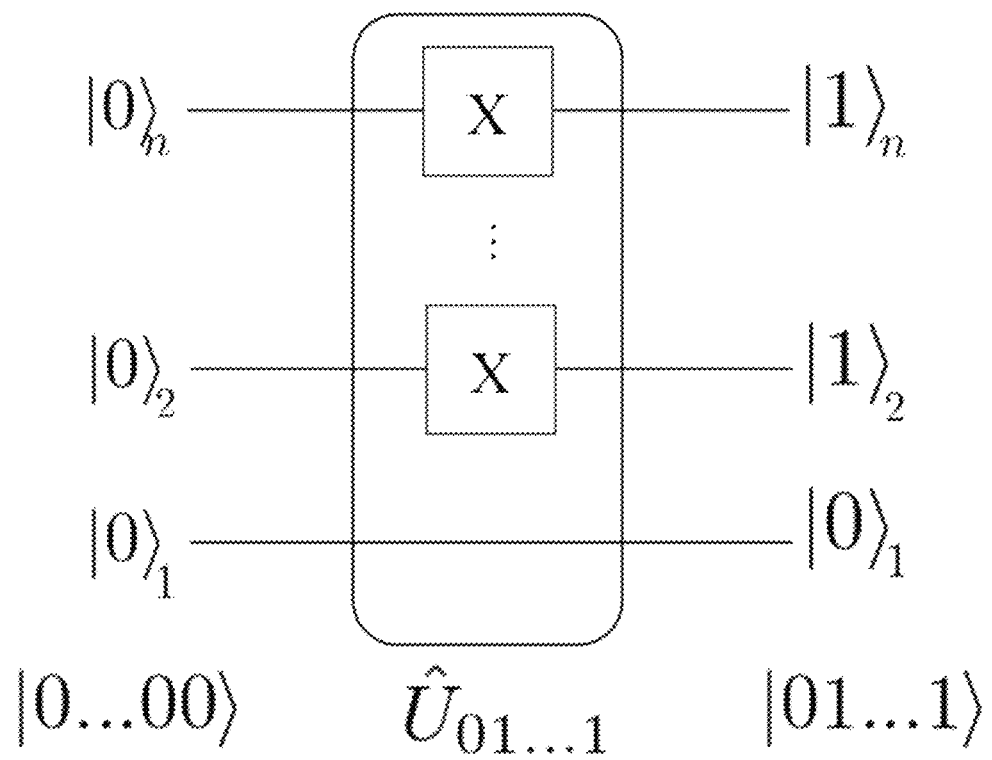
FIG. 11 shows an example of various quantum circuits related to oracle.

As an example, considering that a state in which all qubits are 0 as a certain state α. That is, the oracle can be represented as Equation 30. Here, the operator {U_λ} can specifically configure a quantum circuit as shown in FIG. 11. FIG. 11 shows an example of various quantum circuits related to oracle.

[Equation 30]

$$|\Psi\rangle = (c_{0...00}\hat{U}_{0...00} + c_{0...01}\hat{U}_{0...01} + ... + c_{1...11}\hat{U}_{1...11})|0...00\rangle \quad \text{Eqn. 30}$$

$$\hat{U}_{0...01}|0...00\rangle = |0...01\rangle$$

$$\vdots$$

$$\hat{U}_{1...11}|0...00\rangle = |1...11\rangle$$

That is, it is a quantum circuit in which X gate operation (Pauli matrices of rotation in the x-axis direction) is applied to the qubits to be converted from 0 to 1 among the n qubits. The X gate operation is a gate operation that returns 1 when 0 is input and 0 when 1 is input. The operator {U_λ} can be specifically written down by combining X-gate operations.

Given these concrete quantum circuit representations of the operator {U_λ}, we can actually create an arbitrary oracle by using the sum formula.

4. Others

In this section, a modified example of the quantum computer 1 will be described. That is, the quantum computer 1 according to the present embodiment may be further creatively devised according to the following aspects.

(1) A program that causes the computer to function as the quantum computer 1 may be implemented.

(2) The quantum gate 53 may be implemented independently as a quantum circuit.

Further, the present invention may be provided by each of the following embodiments.

The quantum computer, wherein: the parameter group of k-th layer includes 2 to the (n−k)-th power parameters.

The quantum computer, wherein: assuming that each coefficient in the linear sum of the unitary operators is identified in order by using an index represented by an n-digit binary number, then the setting unit is configured to set the parameters so that parameters included in the parameter group of the k-th layer depend on the ratio of a specific set of coefficients among each of the coefficients, wherein the specific set of coefficients are two coefficients having indices which differ from each other only in the k-th lowest digit, while the other digits coincide with each other.

The quantum computer, wherein: assuming that each parameter included in the parameter group of the k-th layer is identified in order by using an index represented by an (n−k)-digit binary number, then the setting unit is configured to set the parameters so that a first parameter included in the parameter group of the k-th layer depend on the ratio of cosines for a particular set of second parameters included in the parameter group of the (k−1)th layer, wherein the particular set of the second parameters consists of two parameters, each of which has an index with 0 or 1 appended to the end of that of the first parameter.

The quantum computer, wherein: the quantum gate includes control unitary gates of n layers, the control unitary gate of k-th (2≤k≤n) layer inputs one control qubit, k−1 controlled qubits, and m target qubits, and includes first and second control unitary gates of the (k−1)-th layer and a rotation gate, the first control unitary gate is configured to operate the value of the controlled qubits when the value of the control qubits is 0, the second control unitary gate is configured to operate the value of the controlled qubits when the value of the control qubits is 1, and the rotation gate applies on the control qubit.

The quantum computer, wherein: n=2.

The quantum computer, further comprising: an observation unit configured to observe auxiliary output values, which are output values of the n auxiliary qubits at the quantum gate, wherein: the quantum gate is configured to output the product of an input value of the target qubits and the linear sum of the unitary operators as a target output value which is an output value of the target qubits when the auxiliary output values observed by the observation unit are all 0.

The quantum computer, wherein: the quantum gate is configured to output the product of an input value of the target qubit and a first linear sum of the unitary operators as a first target output value when the observation unit observes the auxiliary output values as 0, and output the product of the input value of the target qubit and a second linear sum of the unitary operators as a second target output value when the observation unit observes the auxiliary output values as 1, wherein the second linear sum a Hermitian conjugate of the first linear sum.

The quantum computer, wherein: the first linear sum is an electronic annihilation operator in a predetermined function, the second linear sum is an electronic creation operator in the predetermined function, where the predetermined function is a Green's function or a linear response function, further comprising a quantum phase estimation unit configured to execute quantum phase estimation for the first and second target output values, and wherein: the specification unit is configured to specify the predetermined function based on a result of the quantum phase estimation.

The quantum computer, wherein: the quantum gate is configured to output a state of any of the qubits by outputting the product of the input value of the target qubits and the linear sum of the unitary operators as a standard output when the observation unit observes the auxiliary output values as 0.

A non-transitory computer readable media storing a program, wherein: the program allows a computer to function as the quantum computer.

A quantum calculation method, comprising: a setting step to set a parameter group of n layers based on each coefficient in a linear sum of unitary operators whose number is 2 to the n-th power, wherein the parameter group of k-th (2≤k≤n) layer is recursively set based on the parameter group of (k−1)-th layer; a calculation step to calculate a predetermined calculation on an input value input to each qubit based on parameters included in the parameter group of n layers, wherein each of the qubits has n+m qubits including n auxiliary qubits and m target qubits; and a specification step to specify a linear sum of the unitary operators based on a calculation result in the calculation step.

The quantum calculation method, wherein: the parameter group of k-th layer includes 2 to the (n−k)-th power parameters.

The quantum calculation method, wherein: assuming that each coefficient in the linear sum of the unitary operators is identified in order by using an index represented by an n-digit binary number, then the setting step sets the parameters so that parameters included in the parameter group of the k-th layer depend on the ratio of a specific set of coefficients among each of the coefficients, wherein the specific set of coefficients are two coefficients having indices which differ from each other only in the k-th lowest digit, while the other digits coincide with each other.

The quantum calculation method, wherein: assuming that each parameter included in the parameter group of the k-th layer is identified in order by using an index represented by an (n−k)-digit binary number, then the setting step sets the parameters so that a first parameter included in the parameter group of the k-th layer depend on the ratio of cosines for a particular set of second parameters included in the parameter group of the (k−1)th layer, wherein the particular set of the second parameters consists of two parameters, each of which has an index with 0 or 1 appended to the end of that of the first parameter.

The quantum calculation method, wherein: the calculation unit includes control unitary gates of n layers, the control unitary gate of k-th ($2 \le k \le n$) layer inputs one control qubit and k−1 controlled qubits, and includes first and second control unitary gates of the (k−1)-th layer and a rotation gate, the first control unitary gate is configured to operate the value of the controlled qubits when the value of the control qubits is 0, the second control unitary gate is configured to operate the value of the controlled qubits when the value of the control qubits is 1, and the rotation gate applies on the control qubit.

The quantum calculation method, wherein: n=2.

The quantum calculation method, further comprising: an observation step to auxiliary outputs values that are output values of the n auxiliary qubits at the quantum gate, wherein: the observation step outputs the product of an input value of the target qubit and the linear sum of the unitary operators as a target output value which is an output value of the target qubit when the auxiliary output values observed by the observation step are all 0.

The quantum calculation method, wherein: the calculation step outputs the product of an input value of the target qubit and a first linear sum of the unitary operators as a first target output value when the observation step observes the auxiliary output values as 0, and outputs the product of the input value of the target qubit and a second linear sum of the unitary operators as a second target output value when the observation step observes the auxiliary output values as 1, wherein: the second linear sum a Hermitian conjugate of the first linear sum.

The quantum calculation method, wherein: the first linear sum is an electronic annihilation operator in a predetermined function, the second linear sum is an electronic creation operator in the predetermined function, wherein the predetermined function is a Green's function or a linear response function, a quantum phase estimation step is further comprised to execute quantum phase estimation for the first and second target output values is further comprised, and the specification step specifies the predetermined function based on a result of the quantum phase estimation.

The quantum calculation method, wherein: the calculation step outputs a state of any of the qubits by outputting the product of the input value of the target qubit and the linear sum of the unitary operators as a standard output when the observation step observes the auxiliary output values as 0.

A quantum circuit, comprising: an input unit having n+m qubits including n auxiliary qubits and m target qubits; a calculation unit configured to calculate a predetermined calculation on an input value input from the input unit based on the parameter group of n layers, wherein the parameter group of n layers is determined based on each coefficient in the linear sum of unitary operators whose number is 2 to (n-th) power, and the parameter group of k-th ($2 \le k \le n$) layer is recursively set based on the parameter group of (k−1)-th layer; and a target qubits output unit configured to output the product of the input value input to the target qubits and the linear sum of the unitary operators.

The quantum circuit, wherein: the parameter group of k-th layer includes 2 to the (n−k)-th power parameters.

The quantum circuit, wherein: assuming that each coefficient in the linear sum of the unitary operators is identified in order by using an index represented by an n-digit binary number, then parameters included in the parameter group of the k-th layer are determined so that each of them depends on the ratio of a specific set of coefficients among each of the coefficients, wherein the specific set of coefficients are two coefficients having indices which differ from each other only in the k-th lowest digit, while the other digits coincide with each other.

The quantum circuit, wherein: assuming that each parameter included in the parameter group of the k-th layer is identified in order by using an index represented by an (n−k)-digit binary number, then a first parameter included in the parameter group of the k-th layer are determined so that each of them depends on the ratio of cosines for a particular set of second parameters included in the parameter group of the (k−1)th layer, wherein the particular set of the second parameters consists of two parameters, each of which has an index with 0 or 1 appended to the end of that of the first parameter.

The quantum circuit, wherein: the calculation unit includes control unitary gates of n layers, the control unitary gate of k-th ($2 \le k \le n$) layer inputs one control qubit, k−1 controlled qubits, and m target qubits, and includes first and second control unitary gates of the (k−1)-th layer and a rotation gate, the first control unitary gate is configured to operate the value of the controlled qubits when the value of the control qubits is 0, the second control unitary gate is configured to operate the value of the controlled qubits when the value of the control qubits is 1, and the rotation gate applies on the control qubit.

The quantum circuit, wherein: n=2.

The quantum circuit, wherein: the target qubits output unit is configured to output the product when the observation results of the output values of the n auxiliary qubits are all 0.

The quantum circuit, wherein: the target qubits output unit is configured to output the product of an input value of the target qubit and a linear sum of a unitary operator so as to output the state of an arbitrary qubit when the output values of the n auxiliary qubits are all observed to be 0.

Of course, the above embodiments are not limited thereto.

Finally, various embodiments of the present invention have been described, but these are presented as examples and are not intended to limit the scope of the invention. The novel embodiment can be implemented in various other forms, and various omissions, replacements, and changes can be made without departing from the abstract of the invention. The embodiment and its modifications are included in the scope and abstract of the invention and are included in the scope of the invention described in the claims and the equivalent scope thereof.

The invention claimed is:

1. A quantum computer, comprising:
   a setting unit configured to set a parameter group of n layers based on each coefficient in a linear sum of, unitary operators whose number is 2 to the n-th power, wherein the parameter group of k-th (2≤k≤n) layer is recursively set based on the parameter group of (k−1)-th layer;

a quantum gate
having n+m qubits including n auxiliary qubits and m target qubits, and
configured to execute a predetermined calculation to each qubit based on the parameter group of n layers; and a specification unit configured to specify the linear sum of the unitary operators based on a calculation result of the quantum gate.

2. The quantum computer of claim 1, wherein:
the parameter group of k-th layer includes 2 to the (n−k)-th power parameters.

3. The quantum computer of claim 2, wherein:
assuming that each coefficient in the linear sum of the unitary operators is identified in order by using an index represented by an n-digit binary number, then
the setting unit is configured to set the parameters so that parameters included in the parameter group of the k-th layer depend on the ratio of a specific set of coefficients among each of the coefficients, wherein the specific set of coefficients are two coefficients having indices which differ from each other only in the k-th lowest digit, while the other digits coincide with each other.

4. The quantum computer of claim 3, wherein:
assuming that each parameter included in the parameter group of the k-th layer is identified in order by using an index represented by an (n−k)-digit binary number, then
the setting unit is configured to set the parameters so that a first parameter included in the parameter group of the k-th layer depend on the ratio of cosines for a particular set of second parameters included in the parameter group of the (k−1)-th layer, wherein the particular set of the second parameters consists of two parameters, each of which has an index with 0 or 1 appended to the end of that of the first parameter.

5. The quantum computer of claim 1, wherein:
the quantum gate includes control unitary gates of n layers,
the control unitary gate of k-th (2≤k≤n) layer
inputs one control qubit, k−1 controlled qubits, and m target qubits, and
includes first and second control unitary gates of (k−1)-th layer and a rotation gate,
the first control unitary gate is configured to operate the value of the controlled qubits when the value of the control qubits 0,
the second control unitary gate is configured to operate the value of the controlled qubits when the value of the control qubits 1, and
the rotation gate applies on the control qubit.

6. The quantum computer of claim 5, wherein:
n=2.

7. The quantum computer of claim 1, further comprising:
an observation unit configured to observe auxiliary output values, which are output values of the n auxiliary qubits at the quantum gate, wherein:
the quantum gate is configured to output the product of an input value of the target qubits and the linear sum of the unitary operators as a target output value which is an output value of the target qubits when the auxiliary output values observed by the observation unit are all 0.

8. The quantum computer of claim 7, wherein:
the quantum gate is configured to
output the product of an input value of the target qubit and a first linear sum of the unitary operators as a first target output value when the observation unit observes the auxiliary output values as 0, and
output the product of the input value of the target qubits qubit and a second linear sum of the unitary operators as a second target output value when the observation unit observes the auxiliary output values as 1, wherein the second linear sum a Hermitian conjugate of the first linear sum.

9. The quantum computer of claim 8, wherein:
the first linear sum is an electronic annihilation operator in a predetermined function, the second linear sum is an electronic creation operator in the predetermined function, where the predetermined function is a Green's function or a linear response function,
further comprising a quantum phase estimation unit configured to execute quantum phase estimation for the first and second target output values, and wherein:
the specification unit is configured to specify the predetermined function based on a result of the quantum phase estimation.

10. The quantum computer of claim 7, wherein:
the quantum gate is configured to output a state of any of the qubits by outputting the product of the input value of the target qubits and the linear sum of the unitary operators as a standard output when the observation unit observes the auxiliary output values as 0.

11. A non-transitory computer readable media storing a program, wherein:
the program allows a computer to function as the quantum computer of claim 1.

12. A quantum calculation method, comprising:
a setting step to set a parameter group of n layers based on each coefficient in a linear sum of unitary operators whose number is 2 to the n-th power wherein the parameter group of k-th (2≤k≤n) layer is recursively set based on the parameter group of (k−1)-th layer;
a calculation step to calculate a predetermined calculation on an input value input to each qubit based on the parameter group of n layers, wherein each of the qubits has n+m qubits including n auxiliary qubits and m target qubits; and
a specification step to specify a linear sum of the unitary operators based on a calculation result in the calculation step.

13. A quantum circuit, comprising:
an input unit having n+m qubits including n auxiliary qubits and m target qubits;
a calculation unit configured to calculate a predetermined calculation on an input value input from the input unit based on the parameter group of n layers, wherein the parameter group of n layers is determined based on each coefficient in the linear sum of unitary operators whose number is 2 to the n-th power, and the parameter group of k-th (2≤k≤n) layer is recursively set based on the parameter group of (k−1)-th layer; and
a target qubits output unit configured to output the product of the input value input to the target qubits and the linear sum of the unitary operators.

14. A quantum circuit of claim 13, wherein:
the parameter group of k-th layer includes 2 to the (n−k)-th power parameters.

15. The quantum circuit of claim 14, wherein:

assuming that each coefficient in the linear sum of the unitary operators is identified in order by using an index represented by an n-digit binary number, then parameters included in the parameter group of the k-th layer are determined so that each of them depends on the ratio of a specific set of coefficients among each of the coefficients, wherein the specific set of coefficients are two coefficients having indices which differ from each other only in the k-th lowest digit, while the other digits coincide with each other.

16. The quantum circuit of claim 15, wherein:

assuming that each parameter included in the parameter group of the k-th layer is identified in order by using an index represented by an (n−k)-digit binary number, then a first parameter included in the parameter group of the k-th layer are determined so that each of them depends on the ratio of cosines for a particular set of second parameters included in the parameter group of the (k−1)th layer, wherein the particular set of the second parameters consists of two parameters, each of which has an index with 0 or 1 appended to the end of that of the first parameter.

17. The quantum circuit of claim 13, wherein:

the calculation unit includes control unitary gates of n layers, the control unitary gate of k-th (2≤k≤n) layer
  inputs one control qubit, k−1 controlled qubits, and m target qubits, and
  includes first and second control unitary gates of the (k−1)-th layer and a rotation gate, the first control unitary gate is configured to operate the value of the controlled qubits when the value of the control qubits is 0, the second control unitary gate is configured to operate the value of the controlled qubits when the value of the control qubits is 1, and the rotation gate applies on the control qubit.

18. The quantum circuit of claim 17, wherein:

n=2.

19. The quantum circuit of claim 13, wherein:

the target qubits output unit is configured to output the product when the observation results of the output values of the n auxiliary qubits are all 0.

20. The quantum circuit of claim 13, wherein:

the target qubits output unit is configured to output the product of an input value of the target qubits and a linear sum of a unitary operator so as to output the state of an arbitrary qubit when the output values of the n auxiliary qubits are all observed to be 0.

* * * * *